United States Patent
Chuang et al.

(10) Patent No.: US 7,224,951 B1
(45) Date of Patent: May 29, 2007

(54) PMA RX IN COARSE LOOP FOR HIGH SPEED SAMPLING

(75) Inventors: Jerry Chuang, Sunnyvale, CA (US); William C. Black, Ames, IA (US); Scott A. Irwin, Ames, IA (US)

(73) Assignee: Xilinx, Inc., San Jose, CA (US)

( * ) Notice: Subject to any disclaimer, the term of this patent is extended or adjusted under 35 U.S.C. 154(b) by 579 days.

(21) Appl. No.: 10/659,966

(22) Filed: Sep. 11, 2003

(51) Int. Cl.
*H04B 1/06* (2006.01)
*H04B 1/16* (2006.01)

(52) U.S. Cl. .............. 455/260; 455/179.1; 455/180.3; 455/182.3; 455/318; 455/326; 375/355

(58) Field of Classification Search ............ 455/552.1, 455/297, 298, 180.2, 207–209, 219, 313–318, 455/323–324, 255–260, 265, 179.1–183.1, 455/189.1–192.3, 327, 84; 375/316, 355, 375/347; 348/731, 735, 725–726
See application file for complete search history.

(56) References Cited

U.S. PATENT DOCUMENTS

| | | | |
|---|---|---|---|
| 5,398,263 A * | 3/1995 | Vanderspool et al. ....... 375/376 |
| 6,317,161 B1 * | 11/2001 | Renner et al. .............. 348/536 |
| 6,414,554 B1 * | 7/2002 | Tilley et al. .................. 331/14 |
| 6,591,091 B1 * | 7/2003 | Vorenkamp et al. ..... 455/179.1 |
| 6,774,732 B1 * | 8/2004 | Harnishfeger et al. ........ 331/25 |
| 6,806,786 B1 * | 10/2004 | Lam et al. ................... 331/179 |
| 6,985,705 B2 * | 1/2006 | Shohara .................... 455/164.1 |
| 2002/0071509 A1 * | 6/2002 | Richards et al. ............ 375/355 |

OTHER PUBLICATIONS

U.S. Appl. No. 10/659,803, filed Sep. 11, 2003, Black et al.
U.S. Appl. No. 10/659,971, filed Sep. 11, 2003, Boecker et al.
U.S. Appl. No. 10/660,448, filed Sep. 11, 2003, Groen et al.

* cited by examiner

*Primary Examiner*—Pablo N. Tran
(74) *Attorney, Agent, or Firm*—James Harrison; Michael T. Wallace (57) ABSTRACT

A device and a method for processing high data rate serial data includes circuitry for recovering a clock based on the high data rate input data stream. A transceiver includes a coarse loop of a phase-locked loop that selectively provides a clock having accuracy that is within a specified amount. In a sample mode of operation, only the coarse loop PLL is coupled to provide an error signal from which an oscillation signal and clock may be derived. In a second mode (lock) of operation, the transceiver may lock to the received serial data stream by coupling the fine loop PLL to provide an adjusted error signal. In a third mode of operation, (automatic) the transceiver initially performs coarse loop calibration by de-coupling the fine loop PLL and coupling the coarse loop PLL until a steady state has been reached.

13 Claims, 9 Drawing Sheets

Figure 1
programmable logic device 10

Figure 2
programmable multi-gigabit transceivers 14-28

Figure 3
programmable multi-gigabit
transceivers 14-28

Figure 4A
programmable receive PMA module 40

Figure 4B
programmable transmit PMA module 38

| user selected mode | description |
|---|---|
| 00 | automatic (default) |
| 01 | lock to local reference for data sampling operations |
| 10 | lock to received data |
| 11 | reserved |

Figure 6
PLL 170 operation

Figure 5
PLL 170

Figure 7
transceiver 180

PMA RX IN COARSE LOOP FOR HIGH SPEED SAMPLING

BACKGROUND OF THE INVENTION

1. Technical Field of the Invention

This invention relates generally to communication systems and more particularly to clock recovery circuits used therein.

2. Description of Related Art

Communication systems are known to transport large amounts of data between a plurality of end user devices, which, for example, include telephones, facsimile machines, computers, television sets, cellular telephones, personal digital assistants, etc. As is known, such communication systems may be local area networks (LANs) and/or wide area networks (WANs) that are stand-alone communication systems or interconnected to other LANs and/or WANs as part of a public switched telephone network (PSTN), packet switched data network (PSDN), integrated service digital network (ISDN), or Internet. As is further known, communication systems include a plurality of system equipment to facilitate the transporting of data. Such system equipment includes, but is not limited to, routers, switches, bridges, gateways, protocol converters, frame relays, and private branch exchanges.

The transportation of data within communication systems is governed by one or more standards that ensure the integrity of data conveyances and fairness of access for data conveyances. For example, there are a variety of Ethernet standards that govern serial transmissions within a communication system at data rates of 10 megabits per second, 100 megabits per second, 1 gigabit per second and beyond. Synchronous Optical NETwork (SONET), for example, currently provides for up to 10 gigabits-per-second. In accordance with such standards, many system components and end user devices of a communication system transport data via serial transmission paths. Internally, however, the system components and end user devices may process data in a parallel manner. As such, each system component and end user device must receive the serial data and convert the serial data into parallel data without loss of information. After processing the data, the parallel data must be converted back to serial data for transmission without loss.

Accurate recovery of information from high-speed serial transmissions typically requires transceiver components that operate at clock speeds equal to or higher than the received serial data rate. Higher clock speeds limit the usefulness of prior art clock recovery circuits that require precise alignment of signals to recover clock and/or data. Higher data rates require greater bandwidth for a feedback loop of the clock recovery circuits to operate correctly. Some prior art designs are bandwidth limited.

As the demand for data throughput increases, so do the demands on a high-speed serial transceiver. The increased throughput demands are pushing some current integrated circuit manufacturing processes to their operating limits, where integrated circuit processing limits (e.g., device parasitics, trace sizes, propagation delays, device sizes) and integrated circuit (IC) fabrication limits (e.g., IC layout, frequency response of the packaging, frequency response of bonding wires) limit the speed at which the high-speed serial transceiver may operate without excessive jitter performance and/or noise performance.

A further alternative for high-speed serial transceivers is to use an IC technology that inherently provides for greater speeds. For instance, switching from a Complementary Metal Oxide Semiconductor (CMOS) process to a silicon germanium or gallium arsenide process would allow integrated circuit transceivers to operate at greater speeds, but at substantially increased manufacturing costs. CMOS is more cost effective and provides easier system integration. Currently, for most commercial-grade applications, including communication systems, such alternate integrated circuit fabrication processes are too cost prohibitive for widespread use.

Modern communication systems, including high data rate communication systems, typically include a plurality of circuit boards that communicate with each other by way of signal traces, bundled data lines, back planes, etc. Accordingly, designers of high data rate communication transceiver devices often have conflicting design goals that relate to the performance of the particular device. For example, there are many different communication protocols specified for data rates that range from 2.48832 gigabits per second for OC48, to 9.95 gigabits per second for OC192. Other known standards define data rates of 2.5 gigabits per second (INFINI-BAND) or 3.125 gigabits per second (XAUI). These different data rates affect the allowable rise and fall time of the signal, the peak amplitude of the signal and the response time from an idle state. For example, one protocol may specify a peak voltage range of 200–400 millivolts, while another standard specifies a mutually exclusive voltage range of 500–700 millivolts. Thus, a designer either cannot satisfy these mutually exclusive requirements (and therefore cannot support multiple protocols) or must design a high data rate transceiver device that can adapt according to the protocol being used for the communications.

Along these lines, field programmable gate array (FPGA) circuits are gaining in popularity for providing the required flexibility and adaptable performance described above for those designers that seek to build one device that can operate according to multiple protocols. Thus, while FPGA technology affords a designer an opportunity to develop flexible and configurable hardware circuits, specific designs that achieve the desired operations must still be developed.

Test devices for testing integrated circuits generally include expensive testers that can provide up to 36 pico seconds of resolution and lower end testers that are approximately one-third to one-half of the price of higher end testers that only provide 1.5 nanoseconds of resolution. Accordingly, for integrated circuits requiring greater resolution than 1.5 nanoseconds, today's technology requires a high end tester that can provide up to 36 pico seconds resolution. A need, therefore, exists for an intermediate level tester. At the same time, it is advantageous to develop a device that can provide the required resolution for reading and sampling data without requiring significant design efforts.

BRIEF SUMMARY OF THE INVENTION

The present invention provides for a test device and a method for processing sampling high data rate serial data for test purposes. More specifically, a transceiver, according to an exemplary embodiment of the present invention, is formed to operate as a test device and includes a coarse loop of a phase-locked loop. The transceiver, according to the exemplary embodiment of the present invention, may operate in one of a plurality of modes of operation that enable it to operate as a tester or as a receiver. Ordinarily, a receiver includes phase-locked loop circuitry that locks to a leading edge of received serial data. A tester, because it is trying to read the serial data for test purposes, merely needs to be able to read a data bit anywhere in its period. Thus, an embodiment of the present invention provides for a device that selectively locks to the received serial data to facilitate sampling during the bit periods.

In a sample mode of operation (for example, for use in a test mode whenever the transceiver device is operating as a tester or part of a test system), only the coarse loop PLL is coupled to provide an error signal from which an oscillation signal and clock may be derived. This clock provides the specified accuracy relative to a received serial data rate and may advantageously be used for sampling the incoming serial data stream. In a second mode of operation, the transceiver may lock to the received serial data stream by coupling the fine loop PLL to provide an adjusted error signal from which an oscillation and corresponding recovered clock are derived. In this mode of operation, the recovered clock is synchronized with the incoming serial data stream. In a third mode of operation, which in the described embodiment is a default mode of operation, the transceiver initially performs coarse loop calibration by de-coupling the fine loop PLL and coupling the coarse loop PLL until a steady state has been reached. Next, there is a switch to the fine loop described above for the second mode of operation.

In one embodiment, the coarse loop PLL is coupled and the fine loop PLL is de-coupled only for a specified period. In a second embodiment of the invention, the coarse loop PLL is coupled and the fine loop PLL is de-coupled only until a difference between the clock produced by the error signal generated by the coarse loop PLL and the received serial data stream is within the specified amount. Thereafter, in one embodiment, the coarse loop PLL is de-coupled and the fine loop PLL is coupled to cause the PLL to lock to the received serial data stream. In an alternate embodiment, the coarse loop PLL is not de-coupled although the fine loop PLL is coupled to produce a recovered clock that is locked to the received serial data.

Embodiments of the present invention further includes mode determination logic circuitry for determining the operational mode of the transceiver. As described before, the default mode of operation is the automatic mode of operation in which coarse loop calibration is initially performed by coupling the coarse loop PLL and de-coupling the fine loop PLL. The coarse loop calibration is then followed by fine loop calibration in which, in the described embodiment, the coarse loop PLL is de-coupled and the fine loop PLL is coupled. In addition to operating in the default mode, however, an embodiment of the present invention includes circuitry for receiving an externally selected mode of operation. Accordingly, a user may specify which of a plurality of modes, including automatic, sample, and lock to receiver, should be the specified mode of operation. In the described embodiment, a user selected mode takes preference over defined logic for the automatic, lock and sample modes of operation.

DETAILED DESCRIPTION OF THE INVENTION

Figure 1:
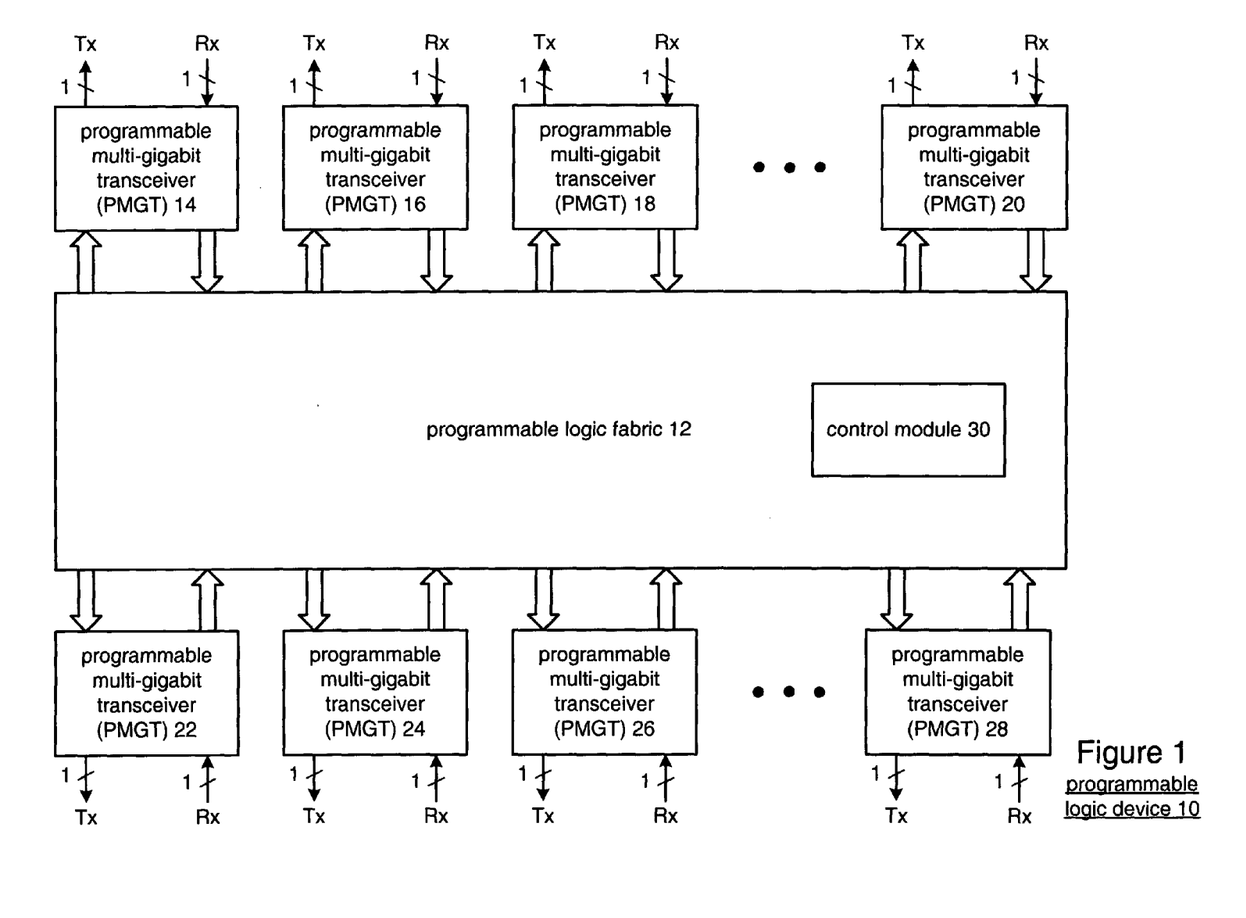
FIG. 1 is a schematic block diagram of a programmable logic device that includes programmable logic fabric, a plurality of programmable multi-gigabit transceivers (PMGTs) and a control module.

FIG. 1 is a schematic block diagram of a programmable logic device 10 that includes programmable logic fabric 12, a plurality of programmable multi-gigabit transceivers (PMGTs) 14–28 and a control module 30. The programmable logic device 10 may be a programmable logic array device, a programmable array logic device, an erasable programmable logic device, and/or a field programmable gate array (FPGA). When the programmable logic device 10 is an FPGA, the programmable logic fabric 12 may be implemented as a symmetric array configuration, a row-based configuration, a sea-of-gates configuration, and/or a hierarchical programmable logic device configuration. The programmable logic fabric 12 may further include at least one dedicated fixed processor, such as a microprocessor core, to further facilitate the programmable flexibility offered by programmable logic device 10.

The control module 30 may be contained within the programmable logic fabric 12 or it may be a separate module. In either implementation, the control module 30 generates the control signals to program each of the transmit and receive sections of the PMGTs 14–28. In general, each of the PMGTs 14–28 performs a serial-to-parallel conversion on receive data and performs a parallel-to-serial conversion on transmit data. The parallel data may be, for instance, 8-bits, 16-bits, 32-bits, or 64-bits wide.

Typically, the serial data will be a 1-bit stream of data that may be a binary level signal, multi-level signal, etc. Further, two or more programmable multi-gigabit transceivers may be bonded together to provide greater transmitting speeds. For example, if PMGTs 14, 16 and 18 are transceiving data at 3.125 gigabits-per-second, PMGTs 14, 16 and 18 may be bonded together such that the effective serial rate is approximately 3 times 3.125 gigabits-per-second.

Each of the PMGTs 14–28 may be individually programmed to conform to separate standards. In addition, the transmit path and receive path of each programmable multi-gigabit transceiver 14–28 may be separately programmed such that the transmit path of a transceiver is supporting one standard while the receive path of the same transceiver is supporting a different standard. Further, the serial rates of the transmit path and receive path may be programmed, for example, from 1 gigabit per second to tens of gigabits per second. The size of the parallel data in the transmit and receive sections, or paths, is also programmable and may vary, for instance, from 8-bits, 16-bits, 32-bits, or 64-bits.

Figure 2:
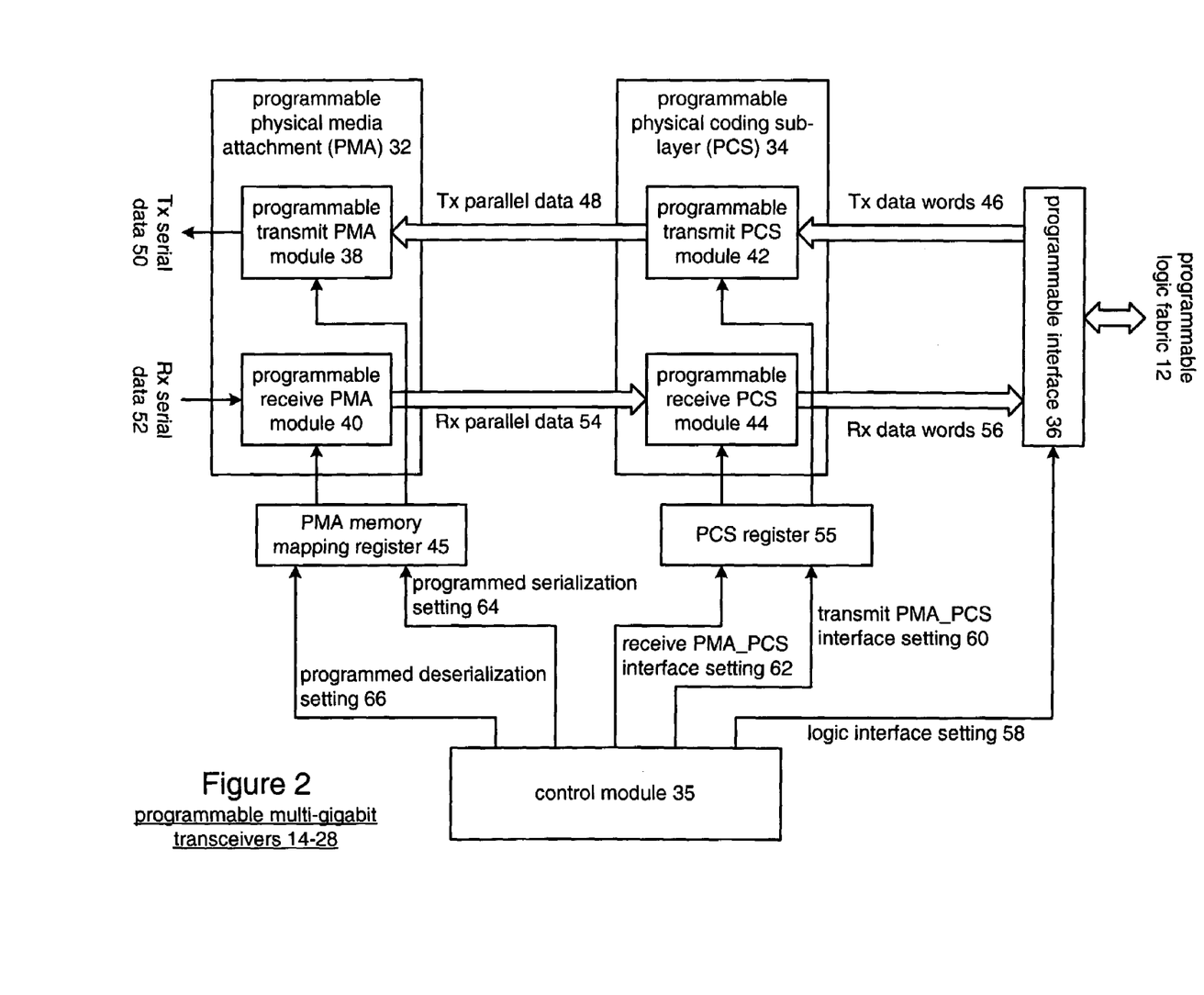
FIG. 2 is a schematic block diagram of one embodiment of a representative one of the programmable multi-gigabit transceivers.

FIG. 2 is a schematic block diagram of one embodiment of a representative one of the PMGTs 14–28. As shown, the programmable multi-gigabit transceiver includes a programmable physical media attachment (PMA) module 32, a programmable physical coding sub-layer (PCS) module 34, a programmable interface 36, a control module 35, a PMA memory mapped register 45 and a PCS register 55. The control module 35, based on the desired mode of operation for the individual programmable multi-gigabit transceiver 14–28, generates a programmed deserialization setting 66, a programmed serialization setting 64, a receive PMA_PCS interface setting 62, a transmit PMA_PCS interface setting 60, and a logic interface setting 58. The control module 35 may be a separate device within each of the programmable multi-gigabit transceivers or included partially or entirely within the control module 30 of FIG. 1.

In either embodiment of the control module 35, the programmable logic device control module 30 determines the corresponding overall desired operating conditions for the programmable logic device 10 and provides the corresponding operating parameters for a given programmable multi-gigabit transceiver to its control module 35, which generates the settings 58–66.

The programmable physical media attachment (PMA) module 32 includes a programmable transmit PMA module 38 and a programmable receive PMA module 40. The programmable transmit PMA module 38, which will be described in greater detail with reference to FIG. 4B, is operably coupled to convert transmit parallel data 48 into transmit serial data 50 in accordance with the programmed serialization setting 64. The programmed serialization setting 64 indicates the desired rate of the transmit serial data 50, the desired rate of the transmit parallel data 48, and the data width of the transmit parallel data 48. The programmable receive PMA module 40 is operably coupled to convert receive serial data 52 into receive parallel data 54 based on the programmed deserialization setting 66. The programmed deserialization setting 66 indicates the rate of the receive serial data 52, the desired rate of the receive parallel data 54, and the data width of the receive parallel data 54. The PMA memory mapped register 45 may store the programmed serialization setting 64 and the programmed deserialization setting 66.

The programmable PCS module 34 includes a programmable transmit PCS module 42 and a programmable receive PCS module 44. The programmable transmit PCS module 42 receives transmit data words 46 from the programmable logic fabric 12 via the programmable interface 36 and converts them into the transmit parallel data 48 in accordance with the transmit PMA_PCS interface setting 60. The transmit PMA_PCS interface setting 60 indicates the rate of the transmit data words 46, the size of the transmit data words (e.g., 1-byte, 2-bytes, 3-bytes, 4-bytes) and the corresponding transmission rate of the transmit parallel data 48. The programmable receive PCS module 44 converts the receive parallel data 54 into receive data words 56 in accordance with the receive PMA_PCS interface setting 62. The receive PMA_PCS interface setting 62 indicates the rate at which the receive parallel data 54 will be received, the width of the receive parallel data 54, the transmit rate of the receive data words 56 and the word size of the receive data words 56.

The control module 35 also generates the logic interface setting 58 that provides the rates at which the transmit data words 46 and receive data words 56 will be transceived with the programmable logic fabric 12. Note that the transmit data words 46 may be received from the programmable logic fabric 12 at a different rate than the receive data words 56 are provided to the programmable logic fabric 12.

As one of average skill in the art will appreciate, each of the modules within the programmable PMA module 32 and programmable PCS module 34 may be individually programmed to support a desired data transfer rate. The data transfer rate may be in accordance with a particular standard such that the receive path, i.e., the path through programmable receive PMA module 40 and the programmable receive PCS module 44, may be programmed in accordance with one standard, while the transmit path, i.e., the path through the programmable transmit PCS module 42 and the programmable transmit PMA module 38, may be programmed in accordance with the same or another standard.

Figure 3:
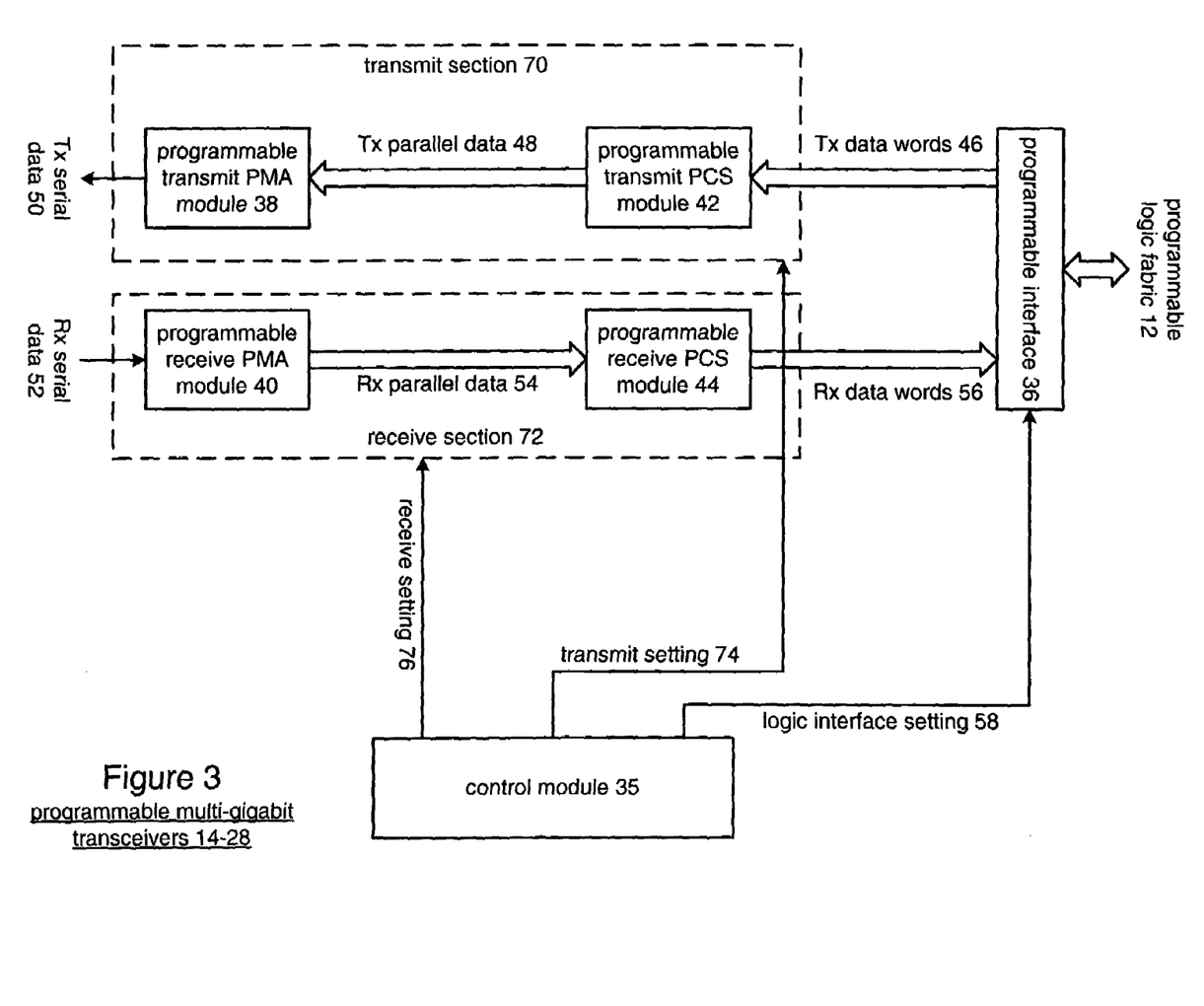
FIG. 3 illustrates an alternate schematic block diagram of a representative one of the programmable multi-gigabit transceivers.

FIG. 3 illustrates an alternate schematic block diagram of a representative one of the PMGTs 14–28. In this embodiment, the PMGTs 14–28 include a transmit section 70, a receive section 72, the control module 35 and the programmable interface 36. The transmit section 70 includes the programmable transmit PMA module 38 and the programmable transmit PCS module 42. The receive section 72 includes the programmable receive PMA module 40 and the programmable receive PCS module 44.

In this embodiment, the control module 35 separately programs the transmit section and the receive section via transmit setting 74 and receive setting 76, respectively. The control module 35 also programs the programmable interface 36 via the logic interface setting 58. Accordingly, the control module 35 may program the receive section 72 to function in accordance with one standard while programming the transmit section 70 in accordance with the same or another standard. Further, the logic interface setting 58 may indicate that the transmit data words 46 are received from the programmable logic fabric 12 at a different rate than the receive data words 56 are provided to the programmable logic fabric 12. As one of average skill in the art will appreciate, the programmable interface 36 may include a transmit buffer and a receive buffer, and/or an elastic store buffer to facilitate the providing and receiving of transmit data words 46 and receive data words 56 to and from the programmable logic fabric 12.

Figure 4A:
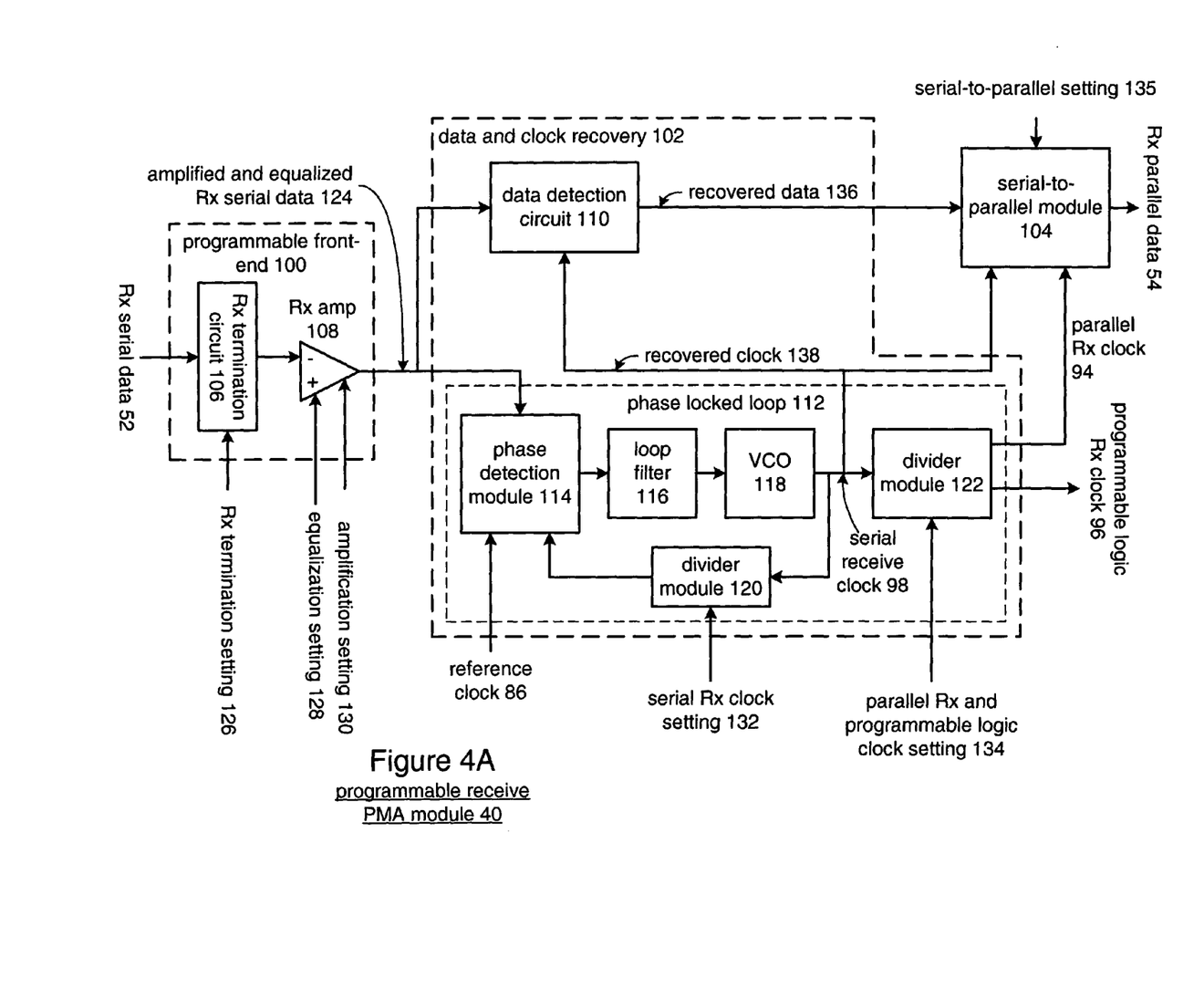
FIG. 4A illustrates a schematic block diagram of a programmable receive PMA module that includes a programmable front-end, a data and clock recovery module, and a serial-to-parallel module.
Figure 4B:
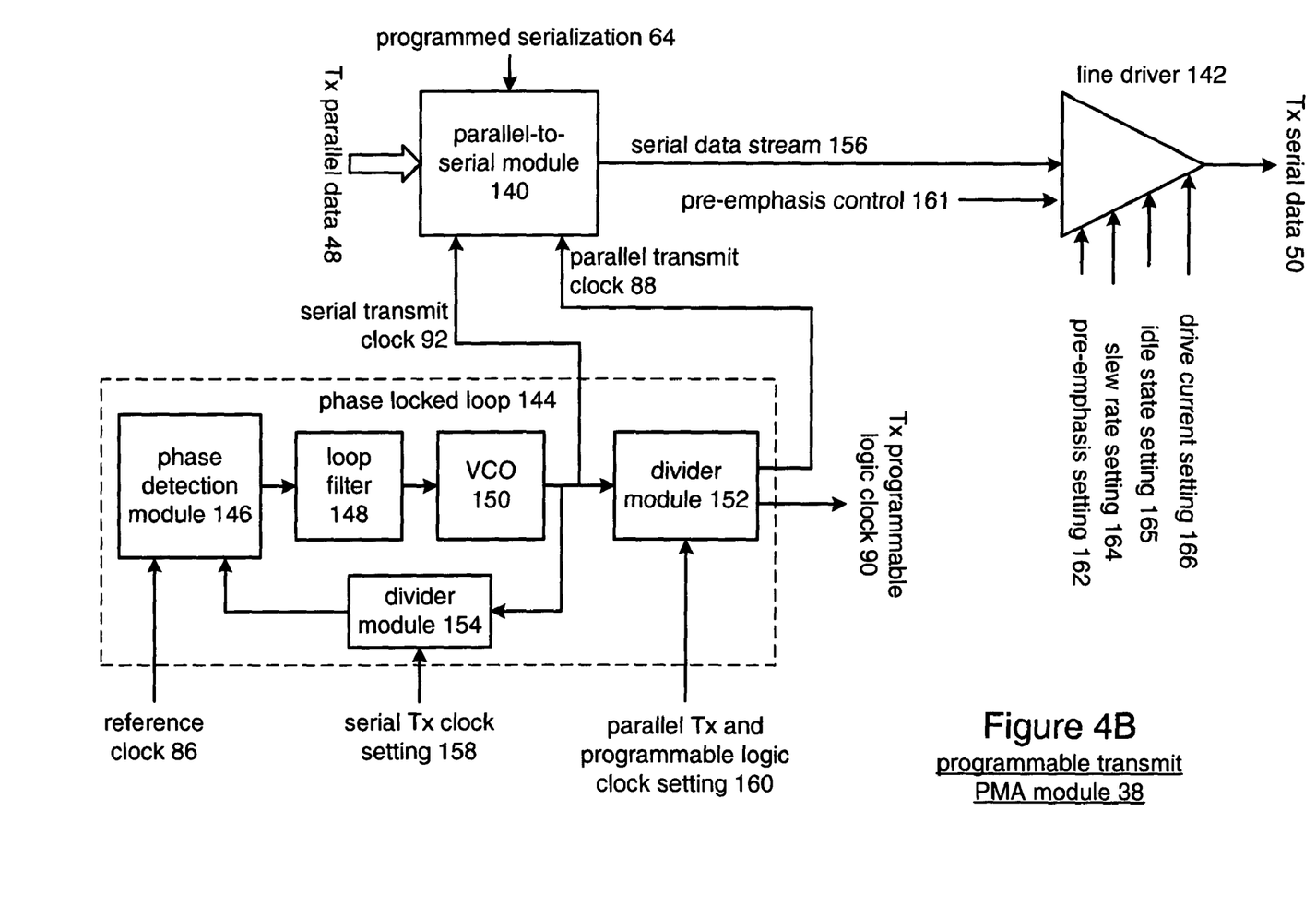
FIG. 4B illustrates a schematic block diagram of a programmable transmit PMA module that includes a phase-locked loop, a parallel-to-serial module, and line driver.

FIG. 4A illustrates a schematic block diagram of the programmable receive PMA module 40 that includes a programmable front-end 100, a data and clock recovery module 102, and a serial-to-parallel module 104. The programmable front-end 100 includes a receive termination circuit 106 and a receive amplifier 108. The data and clock recovery module 102 includes a data detection circuit 110 and a phase-locked loop 112. The phase-locked loop 112 includes a phase detection module 114, a loop filter 116, a voltage controlled oscillator (VCO) 118, a first divider module 120, and a second divider module 122.

The programmable front-end 100 is operably coupled to receive the receive serial data 52 and produce amplified and equalized receive serial data 124 therefrom. To achieve this, the receive termination circuit 106 is programmed in accordance with a receive termination setting 126 to provide the appropriate termination for the transmission line between the programmable receive PMA module 40 and the source that originally transmitted the receive serial data 52. The receive termination setting 126 may indicate whether the receive serial data 52 is a single-ended signal, a differential signal, may indicate the impedance of the transmission line, and may indicate the biasing of the receive termination circuit 106. For a more detailed discussion of the receive termination circuit 106, refer to co-pending patent application entitled RECEIVER TERMINATION NETWORK AND APPLICATION THEREOF, by Charles W. Boecker, et al., and having the same filing date as the present application. This co-pending application is incorporated by reference, herein.

The receive termination circuit 106 further biases the receive serial data 52 and provides the bias adjusted signal to the receive amplifier 108. The equalization and gain settings of the receive amplifier 108 may be adjusted in accordance with equalization setting 128 and amplification setting 130, respectively. The receive amplifier 108 is further described in co-pending patent application entitled ANALOG FRONT-END HAVING BUILT-IN EQUALIZATION AND APPLICATIONS THEREOF, by William C. Black, et al., and having a filing date the same as the present patent application. This co-pending application is incorporated by reference, herein. Note that the receive termination setting 126, the equalization setting 128, and the amplification setting 130 are part of the programmed deserialization setting 66 provided by the control module 35.

The data and clock recovery module 102 receives the amplified and equalized receive serial data 124 via the phase detection module 114 of phase-locked loop 112 and via the data detection circuit 110. The phase detection module 114 has been initialized prior to receiving the amplified and equalized receive serial data 124 by comparing the phase and/or frequency of a reference clock 86 with a feedback reference clock produced by divider module 120. Based on this phase and/or frequency difference, the phase detection module 114 produces a corresponding current that is provided to loop filter 116. The loop filter 116 converts the current into a control voltage that adjusts the output frequency of VCO 118. The divider module 120, based on a serial receive clock setting 132, divides the output oscillation produced by the VCO 118 to produce the feedback signal. Once the amplified and equalized receive serial data 124 is received, the phase detection module 114 compares the phase of the amplified and equalized receive serial data 124 with the phase of the feedback signal and produces a current signal based on the phase difference.

The phase detection module 114 provides the current signal to loop filter 116, which converts it into a control voltage that controls the output frequency of VCO 118. At this point, the output of VCO 118 corresponds to a recovered clock 138 in steady state operation. The recovered clock 138 is provided to the divider module 122, the data detection circuit 110 and to the serial-to-parallel module 104. The data detection circuit 110 utilizes the recovered clock 138 to produce recovered data 136 from the amplified and equalized receive serial data 124. The divider module 122 divides the recovered clock 138, in accordance with a parallel receive and programmable logic clock setting 134, to produce a parallel receive clock 94 and a programmable logic receive clock 96. Note that the serial receive clock setting 132 and the parallel receive and programmable logic clock setting 134 are part of the programmed deserialization setting 66 provided to the programmable receive PMA module 40 by the control module 35. The phase-locked loop (PLL) 112 of FIG. 4A is exemplary and general in nature as there are many different implementations for PLLs according to design requirements. One particular embodiment of a phase-locked loop that may be used for providing a lock to serial data in a receiver mode or to sample data in a test mode is described in greater detail in relation to FIG. 8 which describes a PLL within a clock/data recovery sampler circuit.

The serial-to-parallel module 104, which may include an elastic store buffer, receives the recovered data 136 at a serial rate in accordance with the recovered clock 138. Based on a serial-to-parallel setting 135 and the parallel receive clock 94, the serial-to-parallel module 104 outputs the receive parallel data 54. The serial-to-parallel setting 135, which may be part of the programmed deserialization setting 66, indicates the data rate and data width of the receive parallel data 54.

FIG. 4B illustrates a schematic block diagram of a programmable transmit PMA module 38 that includes a phase-locked loop 144, a parallel-to-serial module 140, and a line driver 142. The phase-locked loop 144 includes a phase detection module 146, a charge pump 147, a loop filter 148, a voltage controlled oscillator (VCO) 150, a divider module 154, and a divider module 152.

The phase detection module 146 compares the phase and/or frequency of the reference clock 86 with the phase and/or frequency of an output produced by divider module 154. The phase detection module 146 generates control signals to charge pump 147 which, in turn, produces a current signal to represent the phase and/or frequency difference between the reference clock 86 and the feedback oscillation. The loop filter 148 converts the current signal into a control voltage that regulates the output oscillation produced by VCO 150. Divider module 154, based on a serial transmit clock setting 158, divides the output oscillation of the VCO 150, which corresponds to a serial transmit clock 92, to produce the feedback oscillation. Note that the serial transmit clock setting 158 may be part of the programmed serialization setting 64 provided to the programmable transmit PMA module 38 by the control module 35.

Divider module 152 receives the serial transmit clock 92 and, based on a parallel transmit and programmable logic clock setting 160, produces a parallel transmit clock 88 and a transmit programmable logic clock 90. The parallel transmit and programmable logic clock setting 160 may be part of the programmed serialization setting 64.

The parallel-to-serial module 140 receives the transmit parallel data 48 and produces therefrom a serial data stream 156. To facilitate the parallel-to-serial conversion, the parallel-to-serial module 140, which may include an elastic store buffer, receives a parallel-to-serial setting to indicate the width of the transmit parallel data 48 and the rate of the transmit parallel data, which corresponds to the parallel transmit clock 88. Based on the parallel-to-serial setting, the serial transmit clock 92 and the parallel transmit clock 88, the parallel-to-serial module 140 produces the serial data stream 156 from the transmit parallel data 48.

The line driver 142 increases the power of the signals forming serial data stream 156 to produce the transmit serial data 50. The line driver 142 may be programmed to adjust its pre-emphasis settings, slew rate settings, and drive settings via a pre-emphasis control signal 161, a pre-emphasis setting signal 162, a slew rate setting signal 164, an idle state setting 165 and a drive current setting 166. The pre-emphasis control signal 161, the pre-emphasis setting signal 162, the slew rate setting signal 164, the idle state setting 165 and the drive current setting 166 may be part of the programmed serialization setting 64. As one of average skill in the art will appreciate, while the diagram of FIG. 4B is shown as a single-ended system, the entire system may use differential signaling and/or a combination of differential and single-ended signaling. Further details on the line driver 142 are described in co-pending patent application entitled DAC BASED DRIVER WITH SELECTABLE PRE-EMPHASIS SIGNAL LEVELS, by Eric D. Groen et al., and having a filing date the same as the present patent application and in co-pending patent application entitled TX LINE DRIVER WITH COMMON MODE IDLE STATE AND SELECTABLE SLEW RATES, by Eric D. Groen et al. and having a filing date the same as the present patent application. These co-pending applications are incorporated by reference, herein.

Figures 5, 6:
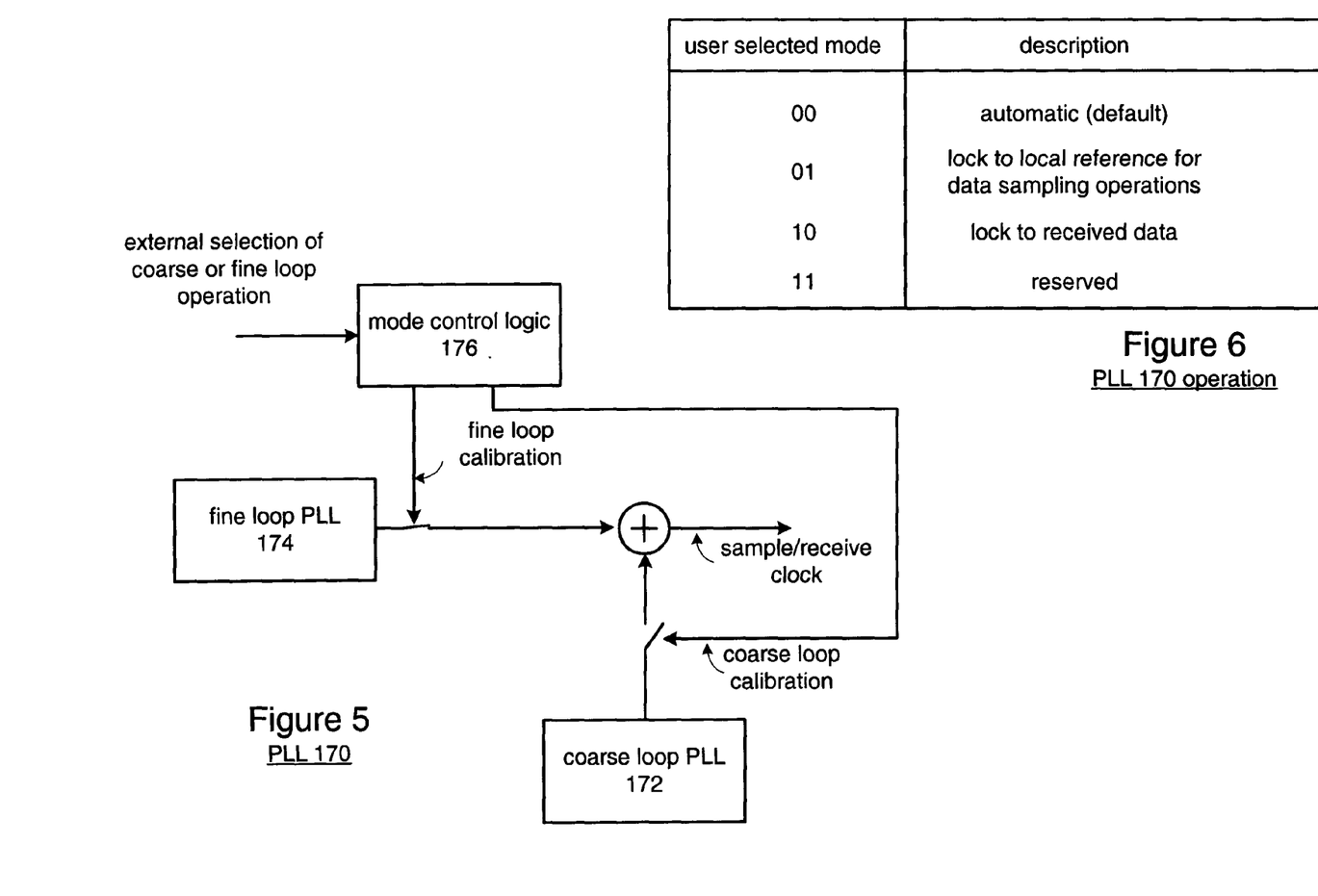
FIG. 5 is a functional block diagram of a phase-locked loop (PLL) formed according to one embodiment of the present invention.
FIG. 6 illustrates a plurality of values of the mode selection signal and corresponding operation of a PLL according to one embodiment of the invention.

FIG. 5 is a functional block diagram of a phase-locked loop (PLL) 170 formed according to one embodiment of the present invention. As may be seen, PLL 170 includes coarse loop PLL 172 and fine loop PLL 174. Further, mode control logic 176 is coupled to produce mode switching signals to selectively couple fine loop PLL 174 and coarse loop PLL 172. The mode switching signals, and more specifically, a fine loop calibration signal and a coarse loop calibration signal, are produced to a pair of switches that selectively couple the fine loop PLL 174 and the coarse loop PLL 172. Generally, the mode control logic 176 operates responsive to a mode selection signal that is received from an external source. During a sample mode of operation, the fine loop PLL 174 is de-coupled while the coarse loop PLL 172 is coupled. During a lock mode of operation, the fine loop PLL 174 is coupled while the coarse loop PLL 172 is de-coupled. In an automatic mode of operation, the coarse loop PLL 172 is initially coupled while the fine loop PLL 174 is de-coupled. Thereafter, the PLL transitions to a lock mode. In an alternate embodiment, both the fine and coarse loop PLLs are coupled in the lock mode of operation. A sample/receive clock is produced according to which of the fine loop and coarse loop PLLs are coupled (or, alternatively, whether both are coupled or just the coarse loop PLL is coupled).

FIG. 6 illustrates a plurality of values of the mode selection signal and corresponding operation of a PLL according to one embodiment of the invention. The mode selection signal values enable a user to specify whether the PLL 170 within a transceiver is to operate according to an automatic mode of operation or whether the phase-locked loop should lock to one of a local reference or to received serial data. The automatic mode of operation is, in the described embodiment, a default mode of operation. Accordingly, without user specification at, for example, power up, then the automatic mode of operation is selected by the mode control logic 176 for operation.

The specific logic for the automatic mode of operation, as well as for locking to the local reference or to the serial data that is received, will be described in greater detail in association with the figures that follow. Generally, as described above, the automatic mode of operation includes initially de-coupling the fine loop PLL 174 and coupling the coarse loop PLL 172 to initially calibrate PLL 170. Thus, as long as the fine loop PLL 174 is de-coupled, an oscillation is produced solely from the coarse loop PLL 172. The oscillation, therefore, as will be shown in greater detail below, is responsive to a reference clock. Thereafter, the mode control logic 176 will, in one embodiment of the invention, de-couple coarse loop PLL 172 and couple fine loop PLL 174 to result in an oscillation being produced that is synchronized or locked with received serial data.

To couple and de-couple the coarse loop PLL 172 and the fine loop PLL 174, mode control logic 176 generates a fine loop calibration signal and a coarse loop calibration signal. Generally, the coarse loop PLL 172 is coupled when the coarse loop calibration signal is a logic 1. The fine loop PLL 174 is coupled when the fine loop calibration signal is a logic 1. Moreover, it is understood that the switches that receive the coarse loop calibration signal, or the fine loop calibration signal, are functional in nature as illustrated herein and can be implemented in a variety of alternate devices. For example, traditional relay switches may be utilized in a circuit of discrete components. In an integrated circuit, however, other devices for performing basic switching functionality may be used, including traditional bipolar transistors and field effect transistors.

Figure 7:
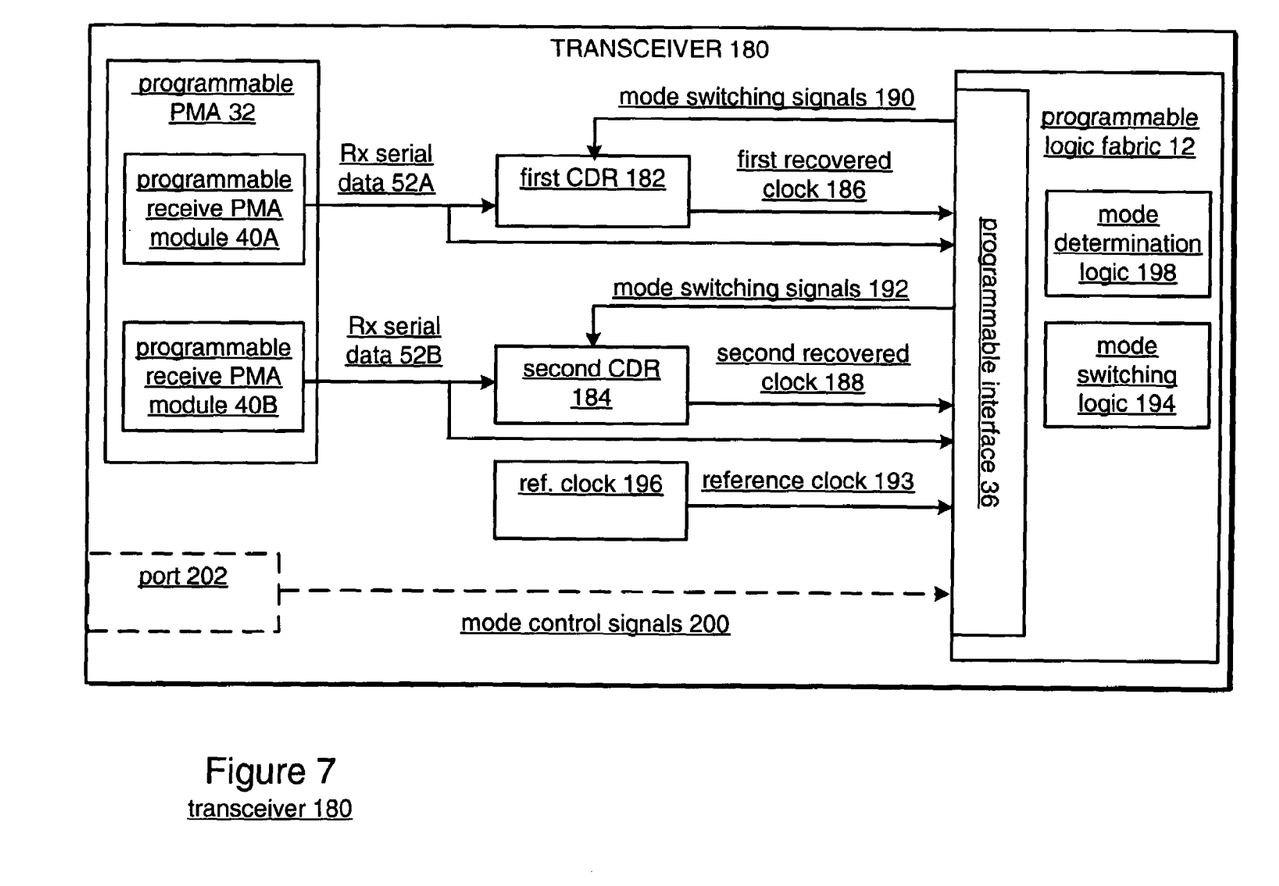
FIG. 7 is a functional block diagram of a transceiver that is formed according to one embodiment of the present invention.

FIG. 7 is a functional block diagram of a transceiver 180 that is formed according to one embodiment of the present invention. Transceiver 180 includes programmable PMA 32 that further includes programmable receive PMA modules 40A and 40B. Programmable receive PMA module 40A produces Rx serial data 52A to a first clock and data recovery (CDR) 182, while programmable receive PMA module 40B produces Rx serial data 52B to a second CDR 184. First CDR 182 produces a first recovered clock 186, while second CDR 184 produces a second recovered clock 188. The first recovered clock 186 is produced by first CDR 182 based upon mode switching signals 190 received from programmable interface 36.

Second CDR 184 produces the second recovered clock 188 based upon mode switching signals 192 that are also received from programmable interface 36. Mode switching signals 190 and 192 are produced by mode switching logic 194 that is formed within programmable logic fabric 12. Mode switching logic 194 produces the mode switching signals 190 and 192 according to a determined mode of operation which is determined by mode determination logic 198. Mode determination logic 198 determines a mode of operation based upon whether the transceiver 180 is operating in a default mode of operation or according to mode control signals 200 that are received from an external source by way of a port 202. In the described embodiment, the default mode is the automatic mode of operation.

First CDR 182 and second CDR 184 both include fine loop and coarse loop PLL. Accordingly, both the first and second CDRs 182 and 184, respectively, couple and de-couple the fine loop PLL and coarse loop PLL according to the mode switching signals 190 and 192 that are received from programmable interface 36. Generally, mode switching logic 194 generates the mode switching signals 190 and 192 and produces them to first CDR 182 and second CDR 184 by way of programmable interface 36.

In one embodiment of the invention, the mode switching signals 190 and 192 comprise a fine loop calibration signal and a coarse loop calibration signal according to whether the mode switching signals are being produced to couple or de-couple fine loop PLL and coarse loop PLL. The actual form of the mode switching signals can be any known format for transmitting control signals. In the described embodiment, discrete traces are used to conduct the fine loop calibration and coarse loop calibration signals.

In a default mode of operation, as determined by mode determination logic 198, the transceiver 180 initially de-couples the fine loop PLL from the first and second CDRs 182 and 184, respectively, to enable the coarse loop PLL to produce an oscillation from which a clock is derived. Once the derived clock is within a specified degree of accuracy relative to a received serial data stream, the coarse loop PLL is de-coupled and the fine loop PLL is coupled to further improve the synchronization between the two.

In an alternate embodiment, the mode switching logic 194 merely de-couples the coarse loop PLL and couples the fine loop PLL after a specified period of time wherein the specified period is one for which it is reasonably expected that the coarse loop PLL has produced a steady state oscillation based upon a received reference clock 193 produced by a reference clock 196. While the automatic mode as described above is a default mode of operation, the transceiver 180 is coupled to receive, from an external source, an indication of a specified mode of operation.

As was shown in FIG. 6, for example, a user may specify whether the transceiver should operate in an automatic (default) mode of operation, whether the PLL should lock to a local reference for data sampling operations, or whether the PLL should lock to received serial data. Accordingly, as may be seen from examining FIG. 7, transceiver 180 includes port 202 for receiving mode control signals 200. In the described embodiment of the invention, the mode control signals 200 are two bits long and are as indicated in FIG. 6. Accordingly, the mode determination logic 198 receives the mode control signals 200 and determines the corresponding mode of operation. Mode switching logic 194 then generates the mode switching signals 190 based on the determined mode of operation as determined by mode determination logic 198

Figure 8:
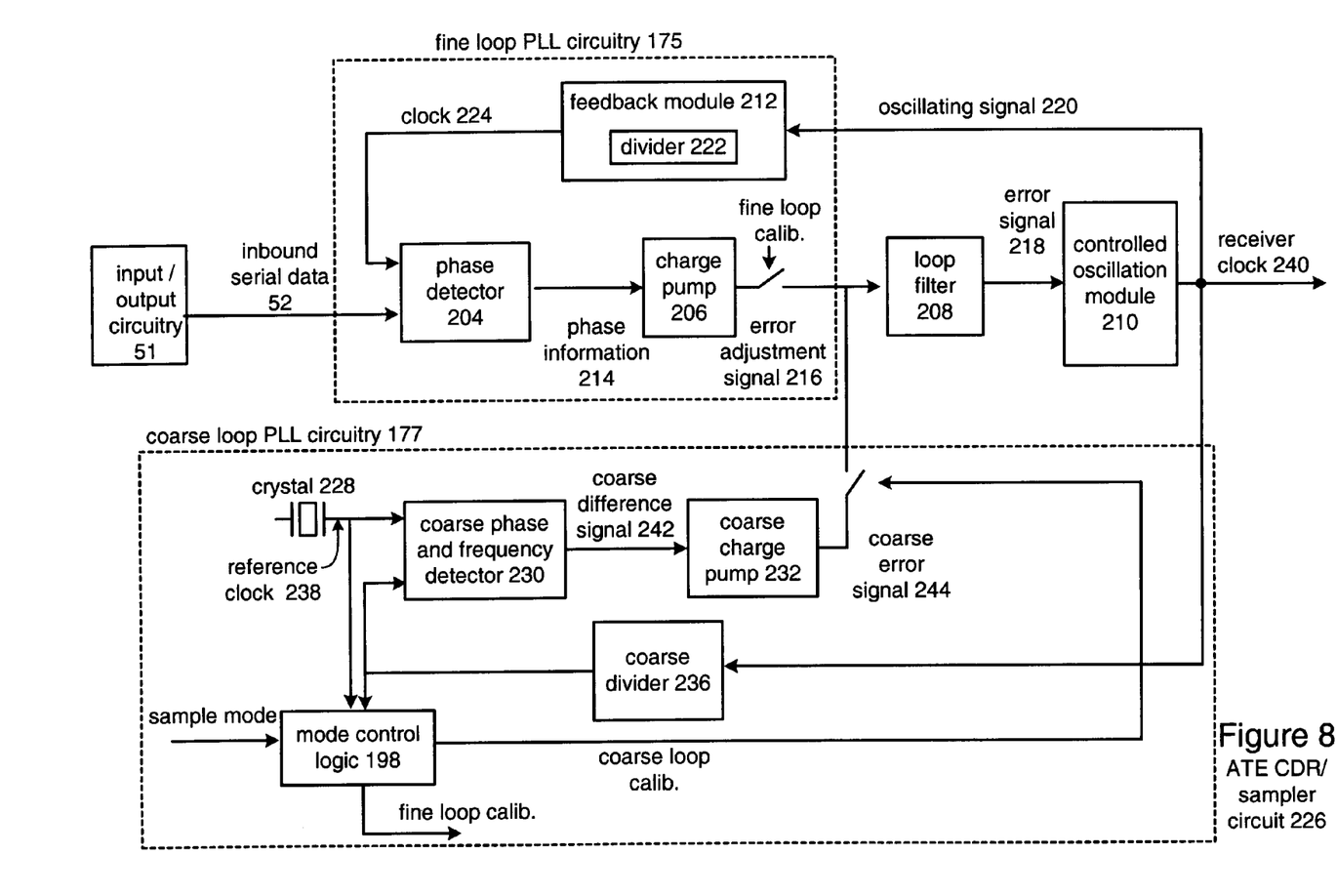
FIG. 8 illustrates a block diagram of a clock data recovery circuit in accordance with one embodiment of the present invention.

FIG. 8 illustrates a block diagram of a clock data recovery (CDR) sampler circuit 226 in accordance with one embodiment of the present invention. CDR sampler circuitry 226, in one embodiment of the invention, is utilized within a automated test equipment to facilitate sampling high data rate serial data. The CDR sampler circuitry may also be used within a transceiver and may be operable to lock to received data for receiver operations. Accordingly, the CDR sampler circuitry may include both fine loop and coarse loop PLL circuitry. Thus, fine loop PLL circuitry 175 includes a phase detector 204, a charge pump 206, a loop filter 208, a controlled oscillation module 210, and a feedback module 212. The dashed box labeled fine loop PLL 175 includes the circuit components that are unique to the fine loop PLL.

Phase detector 204 receives serial data 52, which may be a high data rate bit stream transferring data at 10 or more gigabits per second. Phase detector 204 produces phase information 214 based on the inbound serial data 52 and a recovered clock signal 224 (feedback clock signal). Operation of phase detectors is generally known by one of average skill in the art (though individual details of operation and implementation change and are not known). Phase detector 204 produces phase information 214 to a charge pump such as charge pump 206. Charge pump 206 produces an error adjustment signal 216 based on phase information 214. Loop filter 208 then produces an error signal 218 (a voltage signal) to controlled oscillation module 210.

Controlled oscillation module 210 receives error signal 218 and produces therefrom an oscillating signal 220. Feedback module 212 and a divider 222 generate the feedback signal, which is the recovered clock signal 224, by dividing oscillating signal 220 by a divider value (often a value of 1, in a fine loop PLL where no division is to occur), and by converting the resulting oscillation to a digital signal to represent the recovered clock signal 224. Recovered clock signal 224, generally, is a clock signal that is locked onto the inbound serial data (i.e., inbound serial data 52).

Coarse loop PLL circuitry 177 establishes the desired frequency for the clocking circuit based on a reference clock. To establish the operating frequency for the clocking circuit, crystal oscillator 228 produces a reference clock 238 that is provided to a coarse phase and frequency detector 230. Coarse phase and frequency detector 230 determines the phase and frequency difference between the reference clock 238 and a feedback signal produced by a coarse divider 236.

The coarse divider 236 provides the divided representation of a receiver clock 240 to coarse phase and frequency detector 230 as a feedback signal. Based on the phase and frequency relationship of these signals, coarse phase and frequency detector 230 produces a coarse difference signal 242. Coarse charge pump 232 receives coarse difference signal 242 and produces a current representation (which is converted to voltage through the trans-impedance included at the output of the fine loop PLL charge pump 206 thereof) and provides a coarse error signal 244 to loop filter 208. Controlled oscillation module 210 receives error signal 218 and accordingly adjusts the oscillation frequency.

Controlled oscillation module 210 may utilize inductor-capacitor oscillators or ring oscillators to produce an output oscillation. If an inductor-capacitor oscillator is utilized, noise levels of controlled oscillation module 210 may be reduced.

As illustrated, CDR sampler circuit 226 functionally includes two phase-locked loops. One is a fine phase-locked loop based on the inbound serial data 52 and the other is a coarse phase-locked loop based on reference clock 238. Such a sequential phased-locked loop system enables the receiver section to readily capture and lock to the inbound serial data 52 in an automatic mode of operation as described before. As one of average skill in the art will appreciate, CDR sampler circuit 226 may use single-ended signals or differential signals.

The operation of CDR sampler circuit 226, at a functional block level, is similar to that which is described in relation to PLL 170 of FIG. 5.

Mode control logic 198 produces fine loop calibration and coarse loop calibration signals to selectively coupled fine loop PLL circuitry 175 to create a fine loop PLL (by coupling PLL circuitry 175 to loop filter 208 and controlled oscillation module 210, the fine loop PLL being represented as fine loop PLL 174 in FIG. 5). Similarly, mode control logic 198 produces coarse loop calibration signals to couple coarse loop PLL circuitry 177 to loop filter 208 and controlled oscillation module 210 to create a coarse loop PLL (represented as coarse loop PLL 172 in FIG. 5). According to a received mode of operation indication, mode control logic 198 couples fine loop PLL circuitry 175 and coarse loop PLL circuitry 177 to selectively provide the automatic, sample and lock modes of operation.

As mentioned before, the PLL of FIG. 8 may readily be used within automated test circuitry. In such an embodiment, the test circuitry comprises input circuitry for receiving communication signals and for producing high data rate inbound serial data. Phase-locked loop circuitry coupled to receive the high data rate inbound serial data operates in a sample mode based upon a mode control signal within the ATE. Mode control logic generates the mode control signal to prompt the PLL circuitry to operate in the sample mode. The ATE circuitry may also include test evaluation and display logic. Additionally, the ATE circuitry may be formed at least in part within programmable logic of an FPGA in one embodiment of the invention. Moreover, the ATE circuitry may be formed at least in part within programmable functions of a multi-gigabit transceiver. Thus, the multi-gigabit transceiver may operate as a receiver or as part of an ATE.

Figure 9:
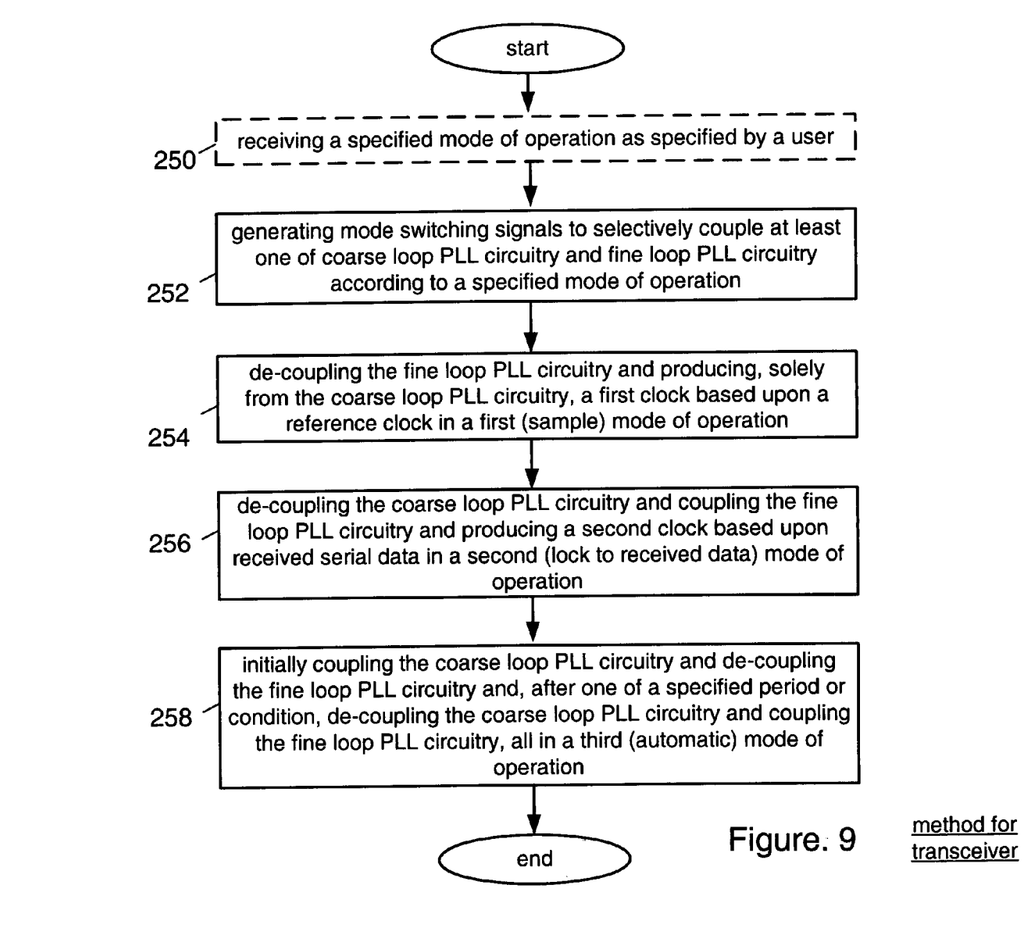
FIG. 9 is a flowchart illustrating a method for a transceiver according to one embodiment of the present invention.

FIG. 9 is a flowchart illustrating a method for a transceiver according to one embodiment of the present invention. As described before, the transceiver may operate in either a default mode of operation or in a mode specified externally, for example, by a user. Thus, the first step of the present invention includes optionally receiving a specified mode of operation as specified by a user (step 250). The specified mode of operation may be an automatic mode of operation which enables the transceiver and, more specifically, the phase-locked loop of the transceiver, to perform coarse loop and then fine loop calibration to produce a recovered clock based on a received serial data, a sample mode of operation, or a lock to a receiver mode of operation.

According to the mode of operation, whether the default mode of operation which, in the described embodiment, is the automatic mode of operation, or a specified mode of operation as specified by a user, the invention includes generating mode switching signals to selectively couple at least one of a coarse loop PLL and fine loop PLL according to the specified mode of operation (step 252). The invention further includes de-coupling the fine loop PLL and producing, solely from the coarse loop PLL, a first clock based upon a reference clock in a first (sample) mode of operation (step 254).

Additionally, the invention includes de-coupling the coarse loop PLL and coupling the fine loop PLL and producing a second clock based upon received serial data in a second (lock to received data) mode of operation (step 256). Finally, the invention also includes initially coupling the coarse loop PLL and de-coupling the fine loop PLL and, after one of a specified period or condition, de-coupling the coarse loop PLL and coupling the fine loop PLL, all in a third (automatic) mode of operation (step 258).

The specified condition is, in one embodiment of the invention, detecting that a difference in frequency or phase between a received signal, here serial data, and the first clock produced by the coarse loop PLL is within a specified amount. In an alternate embodiment, the fine loop PLL is coupled and the coarse loop PLL is de-coupled merely after a period of time to provide for simpler operation.

The invention disclosed herein is adaptable to various modifications and alternative forms. Therefore, specific embodiments have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A transceiver for processing high data rate serial data, comprising:
    phase-locked loop circuitry further including selectable coarse loop PLL and selectable fine loop PLL circuits, the selectable coarse loop PLL for producing a coarse loop synchronized oscillation signal based on a reference clock, the coarse loop synchronized oscillation signal having a specified degree of accuracy relative to a received serial data rate and the selectable fine loop PLL for adjusting the coarse loop synchronized oscillation signal in phase coherence with the received high data rate serial data; and
    mode determination logic coupled to produce mode switching signals to selectively switch the selectable coarse loop PLL and selectable fine loop PLL into and out of coupling according to defined operational logic within the mode determination logic.

2. The transceiver of claim 1 wherein the mode determination logic produces the mode switching signals responsive to one of an automatic mode, a sample mode, and a receive mode of operation.

3. The transceiver of claim 2 wherein the mode determination logic, when in the automatic mode of operation, further operates according to an initial (coarse) calibration mode of operation and a final (fine) calibration mode of operation.

4. The transceiver of claim 3 wherein the mode determination logic, when in the initial calibration mode, selectively de-couples the selectable fine loop PLL and couples the selectable coarse loop PLL.

5. The transceiver of claim 4 wherein the mode determination logic selectively couples the selectable fine loop PLL after a specified period.

6. The transceiver of claim 5 wherein the mode determination logic selectively de-couples the selectable coarse loop PLL.

7. The transceiver of claim 4 wherein the mode determination logic selectively couples the selectable fine loop PLL after determining that a received clock derived from an oscillation corresponding to a coarse error signal is within the specified degree of accuracy relative to the received serial data rate.

8. The transceiver of claim 7 wherein the mode determination logic selectively de-couples the selectable coarse loop PLL.

9. The transceiver of claim 3 wherein the automatic mode of operation is a default mode of operation.

10. The transceiver of claim 9 wherein the mode determination logic operates according to the automatic mode of operation responsive to a mode selection signal received from an external source.

11. The transceiver of claim 1 wherein the mode determination logic, when in the sample mode of operation, selectively de-couples the selectable fine loop PLL and couples the selectable coarse loop PLL as long as the transceiver is in the sample mode of operation.

12. The transceiver of claim 3 wherein the mode determination logic prompts the phase-locked loop circuitry to lock to a local reference for data sampling operations responsive to the mode selection signal received from the external source.

13. The transceiver of claim 3 wherein the mode determination logic prompts the phase-locked loop circuitry to lock to the received serial data rate responsive to the mode selection signal received from the external source.

* * * * *